(12) United States Patent
Masuko

(10) Patent No.: US 9,786,809 B2
(45) Date of Patent: Oct. 10, 2017

(54) METHOD OF FORMING ELECTRODE PATTERN AND METHOD OF MANUFACTURING SOLAR CELL

(71) Applicant: Panasonic Intellectual Property Management Co., Ltd., Osaka (JP)

(72) Inventor: Keiichiro Masuko, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/271,231

(22) Filed: Sep. 21, 2016

(65) Prior Publication Data

US 2017/0012164 A1 Jan. 12, 2017

Related U.S. Application Data

(63) Continuation of application No. PCT/JP2014/082399, filed on Dec. 8, 2014.

(30) Foreign Application Priority Data

Mar. 25, 2014 (JP) .................................. 2014-062110

(51) Int. Cl.
*H01L 31/18* (2006.01)
*H01L 31/0224* (2006.01)

(52) U.S. Cl.
CPC .. *H01L 31/1884* (2013.01); *H01L 31/022425* (2013.01); *H01L 31/022441* (2013.01); *H01L 31/1892* (2013.01); *Y02E 10/50* (2013.01)

(58) Field of Classification Search
CPC ......... H01L 31/1892; H01L 31/022441; H01L 31/1884
See application file for complete search history.

(56) References Cited

U.S. PATENT DOCUMENTS 9,155,204 B2 * 10/2015 Maruyama ............. H05K 3/205
9,362,426 B2 * 6/2016 Goto ............... H01L 31/022441
(Continued)

FOREIGN PATENT DOCUMENTS

| JP | 2001-127409 A | 5/2001 |
| JP | 2008-311665 A | 12/2008 |
| WO | 2012-132854 A1 | 10/2012 |

OTHER PUBLICATIONS

Definition of the term "supported", www.thefreedictionary.com/supported, date accessed May 1, 2017, 2 pages.*

(Continued)

*Primary Examiner* — Earl Taylor
(74) *Attorney, Agent, or Firm* — Metrolexis Law Group, PLLC

(57) ABSTRACT

A method of forming an electrode pattern includes: forming, on a base material, a seed layer having a pattern corresponding to the electrode pattern; forming an organic material layer on the seed layer; producing an electrode layer transfer sheet by forming an electrode layer on the organic material layer via an electroplating process using the seed layer as a seed; disposing the electrode layer transfer sheet on a substrate on which the electrode pattern is to be formed such that the electrode layer is in contact with the substrate and pressure bonding the electrode layer to the substrate; and in a state in which the electrode layer is pressure bonded to the substrate, removing the base material along with the organic material layer and the seed layer to transfer the electrode layer to the substrate.

5 Claims, 8 Drawing Sheets

(56) References Cited

U.S. PATENT DOCUMENTS

| | | | |
|---|---|---|---|
| 2003/0022403 A1* | 1/2003 | Shimoda | B82Y 10/00 438/14 |
| 2004/0200520 A1* | 10/2004 | Mulligan | H01L 31/022441 136/256 |
| 2005/0153107 A1* | 7/2005 | Iijima | B32B 17/10018 428/195.1 |
| 2007/0151599 A1* | 7/2007 | Cousins | H01L 51/4213 136/263 |
| 2008/0128268 A1* | 6/2008 | Lopatin | C25D 5/022 204/192.1 |
| 2008/0132082 A1* | 6/2008 | Lopatin | H01L 31/02008 438/765 |
| 2008/0308150 A1* | 12/2008 | Schindler | H01L 31/022425 136/256 |
| 2009/0162972 A1* | 6/2009 | Xu | H01L 31/022433 438/98 |
| 2011/0043105 A1* | 2/2011 | Cok | H01L 27/3248 313/506 |
| 2012/0132273 A1* | 5/2012 | Lee | H01L 31/022425 136/256 |
| 2012/0305298 A1* | 12/2012 | Uang | H01L 24/13 174/257 |
| 2013/0140696 A1* | 6/2013 | Aoi | H01L 23/49811 257/737 |
| 2013/0213469 A1* | 8/2013 | Kramer | H01L 31/022458 136/256 |
| 2013/0228221 A1* | 9/2013 | Moslehi | H01L 31/022441 136/256 |
| 2014/0020753 A1* | 1/2014 | Goto | H01L 31/022441 136/256 |
| 2014/0318611 A1* | 10/2014 | Moslehi | H01L 31/022441 136/256 |
| 2015/0020877 A1* | 1/2015 | Moslehi | H01L 31/022441 136/256 |
| 2015/0059824 A1* | 3/2015 | Taira | H01L 31/1876 136/244 |
| 2015/0171230 A1* | 6/2015 | Kapur | H01L 31/022441 438/72 |
| 2017/0012164 A1* | 1/2017 | Masuko | H01L 31/1884 |

OTHER PUBLICATIONS

International Search Report (ISR) dated Feb. 10, 2015 for PCT Application No. PCT/JP2014/082399.

* cited by examiner

METHOD OF FORMING ELECTRODE PATTERN AND METHOD OF MANUFACTURING SOLAR CELL

CROSS REFERENCE TO RELATED APPLICATIONS

This application is a U.S. continuation application of PCT International Patent Application Number PCT/JP2014/082399 filed on Dec. 8, 2014, claiming the benefit of priority of Japanese Patent Application Number 2014-062110, filed on Mar. 25, 2014, the entire contents of which are hereby incorporated by reference.

TECHNICAL FIELD

The present disclosure relates to a method of forming an electrode pattern and a method of manufacturing a solar cell.

BACKGROUND ART

Solar cells include, on at least one of the light receiving surface and the back surface, finger electrodes and bus bar electrodes. Back contact solar cells include, on the back surface, n-type and p-type finger electrodes formed in patterns and bus bar electrodes (for example, see WO 2012/132854).

SUMMARY

In back contact solar cells, the electrode patterns are only formed on the back surface. One example of a method used to achieve high output in a back contact solar cell is to form finer electrode patterns. However, forming finer electrode patterns increases process costs.

One object of the present disclosure is to provide a method of forming an electrode pattern in which the electrode pattern can be formed using a simple process, and a method of manufacturing a solar cell using the method of forming the electrode pattern.

A method of forming an electrode pattern according to the present disclosure includes: forming, on a base material, a seed layer having a pattern corresponding to the electrode pattern; forming an organic material layer on the seed layer; producing an electrode layer transfer sheet by forming an electrode layer on the organic material layer via an electroplating process using the seed layer as a seed; disposing the electrode layer transfer sheet on a substrate on which the electrode pattern is to be formed such that the electrode layer is in contact with the substrate and pressure bonding the electrode layer to the substrate; and, in a state in which the electrode layer is pressure bonded to the substrate, removing the base material along with the organic material layer and the seed layer to transfer the electrode layer to the substrate.

A method of manufacturing a solar cell according to the present disclosure includes: producing a solar cell structure on which an electrode pattern is to be formed; producing an electrode layer transfer sheet by forming, on a base material including (i) a seed layer having a pattern corresponding to the electrode pattern and (ii) an organic material layer formed on the seed layer, an electrode layer via an electroplating process using the seed layer as a seed, the electrode layer being formed on the organic material layer of the base material; disposing the electrode layer transfer sheet on the solar cell structure such that the electrode layer is in contact with the solar cell structure and pressure bonding the electrode layer to the solar cell structure; and, in a state in which the electrode layer is pressure bonded to the solar cell structure, removing the base material along with the organic material layer and the seed layer to transfer the electrode layer to the solar cell structure.

Accordingly, the electrode pattern can be formed using a simple process.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

Embodiment

Figure 1:
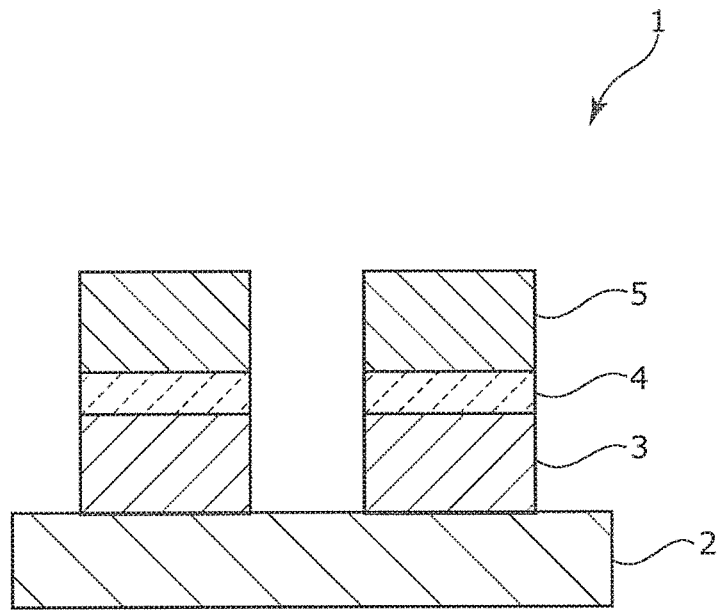
FIG. 1 is a schematic cross section of an electrode layer transfer sheet according to an embodiment.

Hereinafter, a preferred embodiment will be described. However, the following embodiment is merely an example and does not limit the scope of the claims. Moreover, in the drawings, elements having essentially the same functions may share like reference numbers.

FIG. 1 is a schematic cross section of an electrode layer transfer sheet according to this embodiment. As illustrated in FIG. 1, the electrode layer transfer sheet 1 includes a base material 2, a seed layer 3 formed on the base material 2, an organic material layer 4 formed on the seed layer 3, and an electrode layer 5 formed on the organic material layer 4. Examples of the base material 2 include a glass substrate, a silicon substrate, and a resin substrate such as a PET substrate.

The seed layer 3 includes a pattern corresponding to the electrode pattern to be formed. The thickness of the seed layer 3 is preferably in a range from 0.01 micrometers to 1.0 micrometer. After an electrically conducting layer, such as the metal layer to function as the seed layer 3, is formed on the base material 2, the seed layer 3 can be formed by patterning the electrically conducting layer using, for example, a photolithography method. In this case, the seed layer 3 is preferably made of a metal such as copper (Cu), tin (Sn), titanium (Ti), aluminum (Al), nickel (Ni), silver (Ag), gold (Au), or an alloy containing one or more of copper (Cu), tin (Sn), titanium (Ti), aluminum (Al), nickel (Ni), silver (Ag), gold (Au).

As an alternate to the above method, the patterned seed layer 3 may be formed by applying, on the base material 2, a paste including electrically conductive particles via a screen printing or ink jet process. Examples of the electrically conductive particles include the above-listed metals or alloys containing one or more of the above-listed metals.

For example, the organic material layer 4 can be formed by applying, on the seed layer 3, an organic material to be used for forming the organic material layer 4. The organic material layer 4 is preferably formed of, for example, a compound largely containing a hydroxyl. For example, an organic material including a diol may be used as the organic material to be used for forming the organic material layer 4. More specifically, organic material layer 4 preferably includes at least one of: diethylene glycol monoethyl ether (PGME); propylene glycol monomethyl ether acetate (PG-MEA); ethylene glycol monobutyl ether; diethylene glycol monomethyl ether; diethylene glycol butyl ether; butyl diglycol (BDG); and propylene glycol (PG). If the organic material layer 4 is too thin, the organic material in the organic material layer 4 is discretely formed on the seed layer 3, whereby the coverage of the top surface of the seed layer 3 by the organic material layer 4 decreases. If the organic material layer 4 is too thick, the electrical resistance of the organic material layer 4 increases, making the formation of the electrode layer 5 via electroplating (to be described later) difficult.

The electrode layer 5 can be formed on the organic material layer 4 via an electroplating process using the seed layer 3 as a seed. Here, a "seed" means the part through which current is passed upon growing the plating. The electrode layer 5 may be made of a metal such as copper (Cu), tin (Sn), titanium (Ti), aluminum (Al), nickel (Ni), silver (Ag), gold (Au), or an alloy containing one or more of copper (Cu), tin (Sn), titanium (Ti), aluminum (Al), nickel (Ni), silver (Ag), gold (Au). The thickness of the electrode layer 5 is determined in accordance with the thickness of the electrode pattern to be formed.

Figure 2:
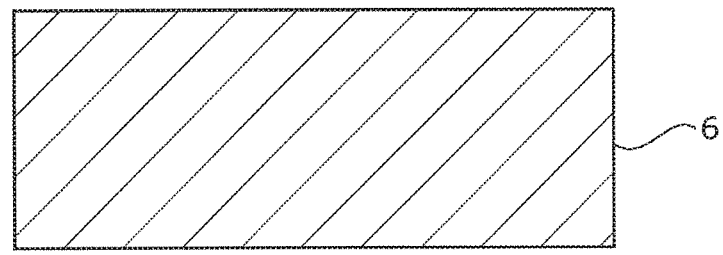
FIG. 2 is a schematic cross section of a substrate on which an electrode layer is to be formed according to an embodiment.
Figure 3:
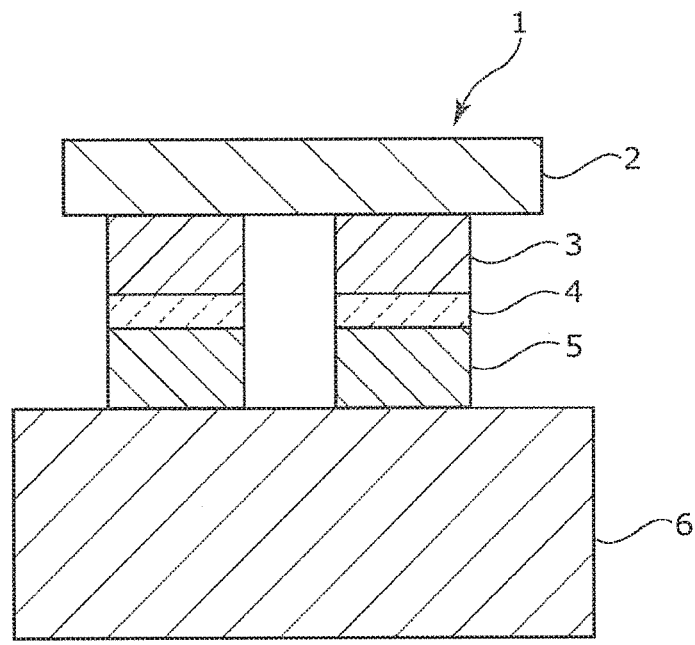
FIG. 3 is a schematic cross section illustrating a state in which an electrode layer transfer sheet is disposed on a substrate such that the electrode layer contacts the substrate, according to an embodiment.
Figure 4:
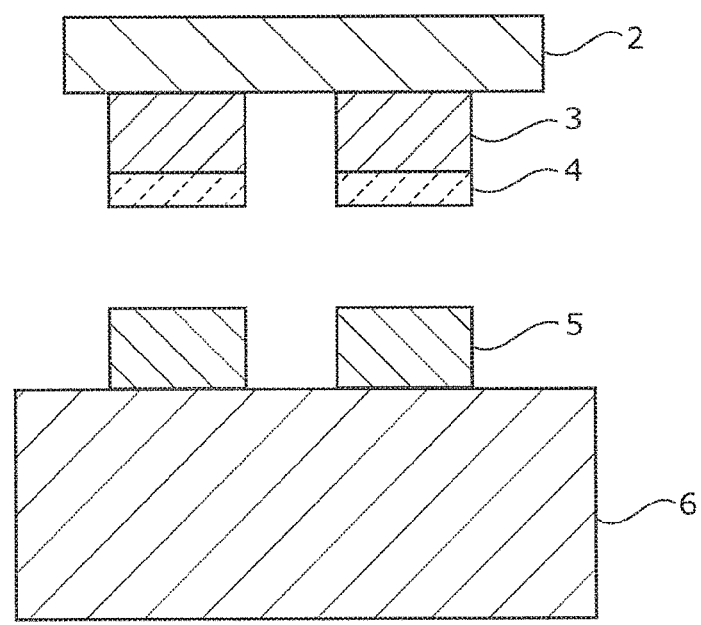
FIG. 4 is a schematic cross section illustrating a state in which an electrode layer has been transferred to a substrate by removing a base material along with an organic material layer and a seed layer in a state in which the electrode layer is pressure bonded to the substrate, according to an embodiment.

FIG. 2 through FIG. 4 are schematic cross sections illustrating processes for forming an electrode pattern on a substrate, employing the electrode layer transfer sheet 1 illustrated in FIG. 1. FIG. 2 is a schematic cross section of a substrate 6 on which an electrode layer is to be formed. The substrate 6 may be a substrate before the electrode pattern is formed, and is not particularly limited. For example, the substrate 6 may be a semiconductor substrate on which a variety of semiconductor layers are formed. Examples include a solar cell structure before bus bar electrodes and finger electrodes are formed thereon.

FIG. 3 is a schematic cross section illustrating a state in which the electrode layer transfer sheet 1 is disposed on the substrate 6 such that the electrode layer 5 contacts the substrate 6. As illustrated in FIG. 3, the electrode layer transfer sheet 1 is disposed on the substrate 6 such that the electrode layer 5 contacts the substrate 6. In this state, the electrode layer transfer sheet 1 is pressed down on the substrate 6 to pressure bond the electrode layer 5 to the substrate 6.

FIG. 4 is a schematic cross section illustrating a state in which the electrode layer 5 has been transferred to the substrate 6 by removing the base material 2 along with the organic material layer 4 and the seed layer 3 in a state in which the electrode layer 5 is pressure bonded to the substrate 6. Since the adhesive force between the organic material layer 4 and the electrode layer 5 is weak, the base material 2 can be picked up to remove the base material 2 along with the organic material layer 4 and the seed layer 3. Here, a portion of the organic material layer 4 may remain on the electrode layer 5. In such a case, the remaining organic material layer 4 can be removed by cleaning the substrate 6.

With this, the electrode layer 5 can be transferred to the substrate 6 to form an electrode pattern.

The seed layer 3 and the organic material layer 4 remain on the removed base material 2. Thus, the electrode layer 5 can be formed on the organic material layer 4 of the removed base material 2 via an electroplating processes so that the configuration can be reused as the electrode layer transfer sheet 1. If the organic material layer 4 becomes too thin, an organic material may be reapplied and the electrode layer 5 may be formed after the organic material layer 4 is repaired.

With this, in this embodiment, an electrode pattern can be formed on the substrate using a simple process. More specifically, since the removed base material can be reused to form another electrode pattern, electrode patterns can be formed at low cost.

FIG. 5 through FIG. 13 are schematic plan views and schematic cross sections illustrating processes for manufacturing a solar cell using the method of forming an electrode pattern according to this embodiment.

Figure 5:
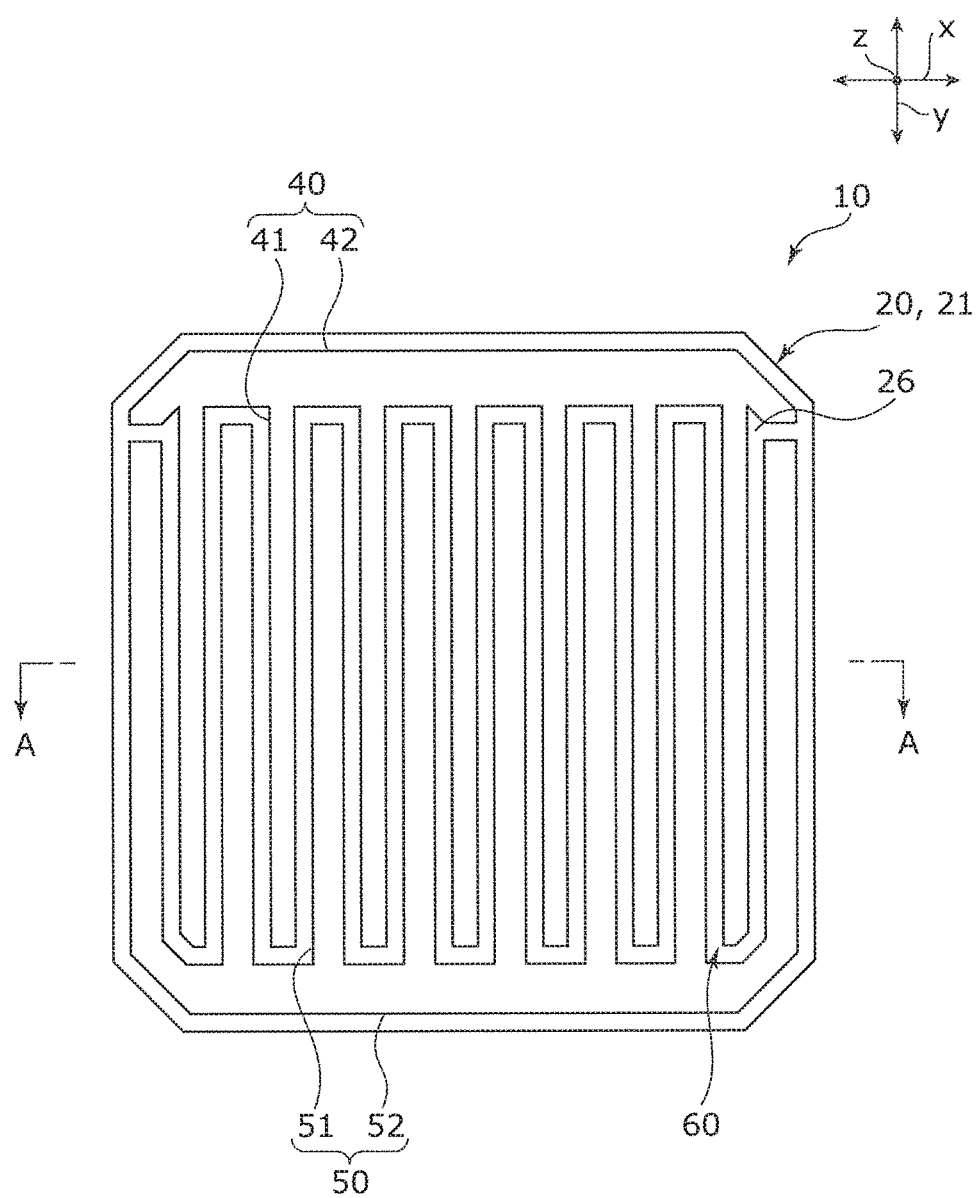
FIG. 5 is a schematic plan view of a solar cell according to an embodiment.

FIG. 5 is a schematic plan view of the back surface of the solar cell according to this embodiment. As illustrated in FIG. 5, the solar cell 10 includes a photoelectric conversion unit 20 that generates carriers (electrons and electron holes) by receiving light such as sunlight, and an n-side electrode 40 and a p-side electrode 50 that are formed on the back surface of the photoelectric conversion unit 20. In the solar cell 10, carriers generated by the photoelectric conversion unit 20 are collected by the n-side electrode 40 and the p-side electrode 50. Here, the "back surface" is the surface on the reverse side of the solar cell 10 relative to the "light receiving surface" on which external light is incident. In other words, the surface on which the n-side electrode 40 and the p-side electrode 50 are formed is the back surface.

In this embodiment, the n-side electrode 40 includes finger electrodes 41 and a bus bar electrode 42 that connects the finger electrodes 41, and the p-side electrode 50 includes finger electrodes 51 and a bus bar electrode 52 that connects the finger electrodes 51. The bus bar electrodes 42 and 52 may be formed as a module with the solar cell 10 by being electrically connected with an electrical line component not illustrated in the drawings.

In this embodiment, the photoelectric conversion unit 20 includes an n-type monocrystalline silicon substrate 21, which is a crystalline semiconductor substrate. The crystalline semiconductor substrate may be an n-type polycrystalline silicon substrate, or a p-type monocrystalline or polycrystalline silicon substrate.

The n-type monocrystalline silicon substrate 21 functions as a power generating layer. The n-type monocrystalline silicon substrate 21 has a thickness of, for example, 100 to 300 micrometers. The light receiving surface of the n-type monocrystalline silicon substrate 21 is preferably a textured surface (not illustrated in the drawings). Here, a "textured surface" is an uneven surface that inhibits rear surface reflection and increases the amount of light absorbed by the photoelectric conversion unit 20. One specific example of a textured surface is a pyramid-shaped (quadrangular pyramid, truncated quadrangular pyramid) uneven surface formed by anisotropic etching the light receiving surface having a (100) surface.

Figure 6:
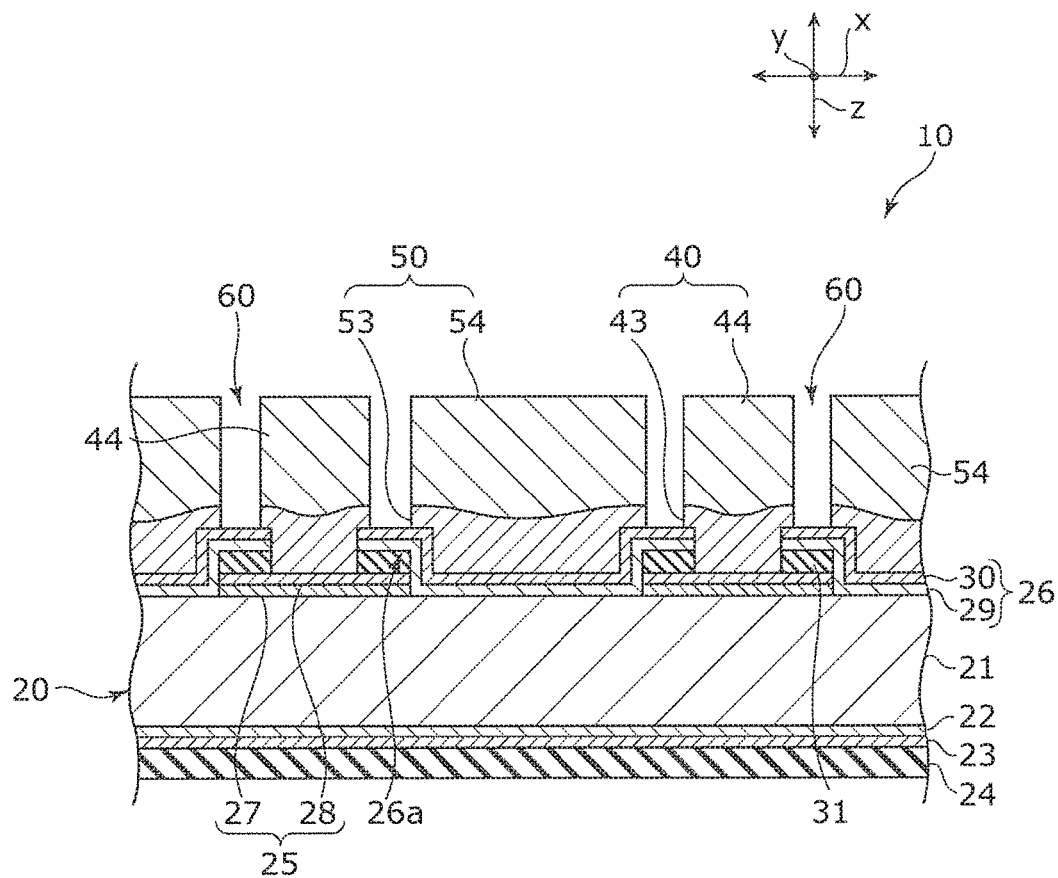
FIG. 6 is a schematic cross sectional view taken along line A-A in FIG. 5.

FIG. 6 is a cross sectional view taken along line A-A in FIG. 5. As illustrated in FIG. 6, an i-type amorphous silicon layer 22, an n-type amorphous silicon layer 23, and a protective layer 24 are formed, in the listed order, on the light receiving surface side of the n-type monocrystalline silicon substrate 21. The i-type amorphous silicon layer 22 and the n-type amorphous silicon layer 23 function as a passivation layer. The protective layer 24 protects the passivation layer and functions to prevent reflection.

The i-type amorphous silicon layer 22 is a thin film layer of an intrinsic amorphous silicon, and has a thickness of, for example, about 0.1 nanometers to 25 nanometers. The n-type amorphous silicon layer 23 is, for example, a thin film layer of an amorphous silicon doped with phosphorus (P), and has a thickness of about 2 nanometers to 50 nanometers.

The protective layer 24 is preferably formed from a highly light transmissive material. Examples of such a material include silicon oxide (SiO2), silicon nitride (SiN), and silicon oxynitride (SiON). In this embodiment, an SiN layer is formed as the protective layer 24. The protective layer 24 preferably has a thickness of, for example, 80 nanometers to 1 micrometer, but the thickness is adjustable taking into account reflection prevention characteristics.

In the photoelectric conversion unit 20, an IN amorphous silicon layer 25 (hereinafter referred to as "IN layer 25") that defines an n-type region and a IP amorphous silicon layer 26 (hereinafter referred to as "IP layer 26") that defines a p-type region are stacked on the back surface side of the n-type monocrystalline silicon substrate 21. The top surface of the IN layer 25 is electrically insulated from the IP layer 26 by an insulating layer 31. The IN layer 25 and the IP layer 26 are directly stacked on the back surface of the n-type monocrystalline silicon substrate 21. However, the insulating layer 31 is stacked on a portion of the IN layer 25.

The IN layer 25 includes an i-type amorphous silicon layer 27 stacked on the back surface of the n-type monocrystalline silicon substrate 21, and an n-type amorphous silicon layer 28 stacked on the i-type amorphous silicon layer 27. The i-type amorphous silicon layer 27 and the n-type amorphous silicon layer 28 may be formed to have the same configurations and thicknesses as the i-type amorphous silicon layer 22 and the n-type amorphous silicon layer 23, respectively.

The IP layer 26 includes an i-type amorphous silicon layer 29 stacked mainly on the back surface of the n-type monocrystalline silicon substrate 21, and a p-type amorphous silicon layer 30 stacked on the i-type amorphous silicon layer 29. For example, the i-type amorphous silicon layer 29 may be formed to have the same configuration and thickness as the i-type amorphous silicon layer 22 and the i-type amorphous silicon layer 27. The p-type amorphous silicon layer 30 is, for example, a thin film layer of an amorphous silicon doped with boron (B). The thickness of the p-type amorphous silicon layer 30 is preferably about 2 nanometers to 5 nanometers.

The IN layer 25 and the IP layer 26 are preferably formed in an alternating fashion in a direction parallel to the back surface, from the viewpoint of photoelectric conversion efficiency, for example. Moreover, the IN layer 25 and the IP layer 26 are preferably formed so as to cover a wide area of the back surface of the n-type monocrystalline silicon substrate 21. As such, it is preferable that a portion of one of the IN layer 25 and the IP layer 26 overlaps a portion of the other so that the layers are stacked with no gap therebetween.

Hereinafter, an example in which the IP layer 26 is stacked so as to overlap the IN layer 25 will be given. Then, the overlapping region of the IN layer 25 and the IP layer 26, referred to as the overlapping portion 26a, will be described.

In the overlapping portion 26a, the insulating layer 31 is preferably provided in at least a portion of the area between the top surface of the IN layer 25 and the IP layer 26. The insulating layer 31 has a function of increasing the electrical insulation between the IN layer 25 and the IP layer 26. The insulating layer 31 may have the same configuration and thickness as the protective layer 24. In particular, the insulating layer 31 is preferably an SiN layer.

The insulating layer 31 is formed in the entire region in which the IP layer 26 is stacked on the IN layer 25—that is to say, formed along the overlapping portion 26a. The insulating layer 31 is not stacked on the IN layer 25 in regions in which the IP layer 26 is not stacked.

The n-side electrode 40 is an electrode that collects carriers (electrons) from the IN layer 25 of the photoelectric conversion unit 20. The n-side electrode 40 is formed directly on the IN layer 25. The p-side electrode 50 is an electrode that collects carriers (electron holes) from the IP layer 26 of the photoelectric conversion unit 20. The p-side electrode 50 is formed directly on the IP layer 26. In this embodiment, the stacked surface area of the IP layer 26 is greater than the stacked surface area of the IN layer 25, which makes the stacked surface area of the p-side electrode 50 greater than the stacked surface area of the n-side electrode 40.

An isolation trench 60 is formed between the n-side electrode 40 and the p-side electrode 50 and separates the electrodes. The isolation trench 60 is preferably formed on the IP layer 26. The isolation trench is preferably formed on the overlapping portion 26a.

The n-side electrode 40 has a stacked structure including an n-side base layer 43 formed on the IN layer 25 and an n-side main conducting layer 44 formed on the n-side base layer 43. The p-side electrode 50 has a stacked structure including a p-side base layer 53 formed on the IP layer 26 and a p-side main conducting layer 54 formed on the p-side base layer 53.

In this embodiment, the main conducting layers 44 and 54 are formed by a method of forming an electrode pattern according to this disclosure, as to be described later. Thus, the main conducting layers 44 and 54 are preferably metal layers. The base layers 43 and 53 are preferably transparent conducting layers (TCO films). The transparent conducting layers have a function of preventing the photoelectric conversion unit 20 and the metal layers from contacting to prevent the metal layers and the semiconductors from alloying to increase the reflectivity of incident light.

The transparent conducting layers (TCO films) are preferably formed from at least one type of metal oxide such as indium oxide having a polycrystalline structure (In2O3), zinc oxide (ZnO), tin oxide (SnO2), and titanium oxide (TiO2). These metal oxides may be doped with a dopant such as tin (Sn), zinc (Zn), tungsten (W), antimony (Sb), titanium (Ti), aluminum (Al), cerium (Ce), and gallium (Ga), and is particularly preferably ITO of In2O3 doped with Sn. The concentration of the dopant may be 0 at. % to 20 at. %. The thicknesses of the transparent conducting layers are preferably about 50 nanometers to 100 nanometers.

The metal layers are preferably formed from a metal that is highly electrically conductive and highly reflective. Moreover, the metal layers are preferably formable via an electroplating method. More specifically, the metal layers may be made of a metal such as copper (Cu), tin (Sn), titanium (Ti), aluminum (Al), nickel (Ni), silver (Ag), gold (Au), or an alloy containing one or more of copper (Cu), tin (Sn), titanium (Ti), aluminum (Al), nickel (Ni), silver (Ag), gold (Au).

The main conducting layers 44 and 54 are particularly preferably Cu layers, from the perspectives of electrical conductivity, reflectivity, and material costs. The Cu layers preferably have a thickness of, for example, about 0.5 micrometers to 50 micrometers.

Next, with reference to FIG. 7 through FIG. 13, a method of manufacturing the solar cell 10 according to this embodiment will be described.

First, with reference to FIG. 7 through FIG. 10, manufacturing processes of a solar cell structure 15 will be described.

Figure 7:
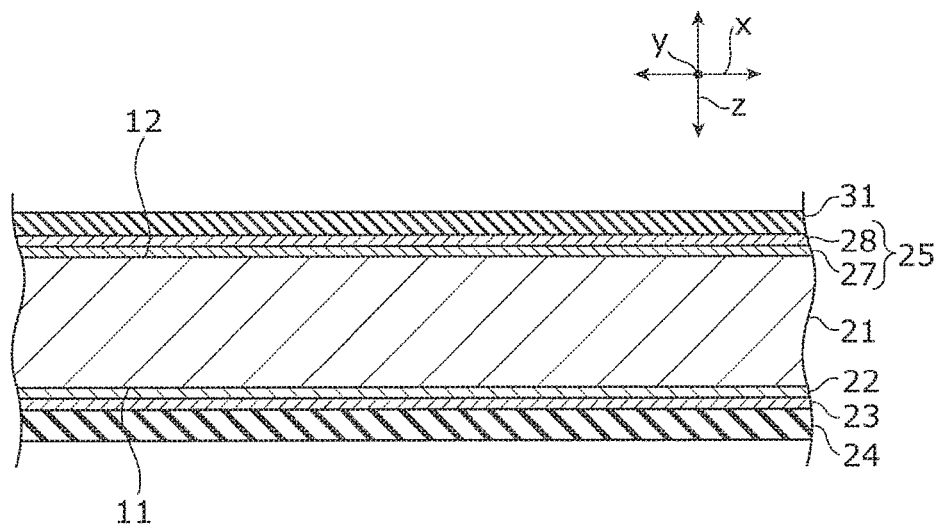
FIG. 7 is a schematic cross sectional view illustrating a process in the manufacturing of a solar cell according to an embodiment.

As illustrated in FIG. 7, the n-type monocrystalline silicon substrate 21 is set in a vacuum chamber, and an i-type amorphous silicon layer, a n-type amorphous silicon layer, and an insulating layer (protective layer) are stacked, in the listed order, via a plasma-enhanced chemical vapor deposition (PECVD) or a sputtering method. In this embodiment, the i-type amorphous silicon layer 22, the n-type amorphous silicon layer 23, and the protective layer 24 are stacked, in the listed order, on the light receiving surface 11 of the n-type monocrystalline silicon substrate 21, and the i-type amorphous silicon layer 27, the n-type amorphous silicon layer 28, and the insulating layer 31 are stacked, in the listed order, on the back surface 12.

Silane gas (SiH4) diluted with hydrogen (H2) is used as the source gas in the stacking of the i-type amorphous silicon layers 22 and 27 via PECVD. Silane gas (SiH4) added with phosphine (PH3) and diluted with hydrogen (H2) is used as the source gas in the stacking of then-type amorphous silicon layers 23 and 28 via PECVD.

Before the stacking of the i-type amorphous silicon layer 22, etc., the light receiving surface 11 of the n-type monocrystalline silicon substrate 21 is preferably treated so as to have a textured surface. The textured surface may be formed by, for example, anisotropic etching a (100) surface using a potassium hydroxide (KOH) aqueous solution.

Figure 8:
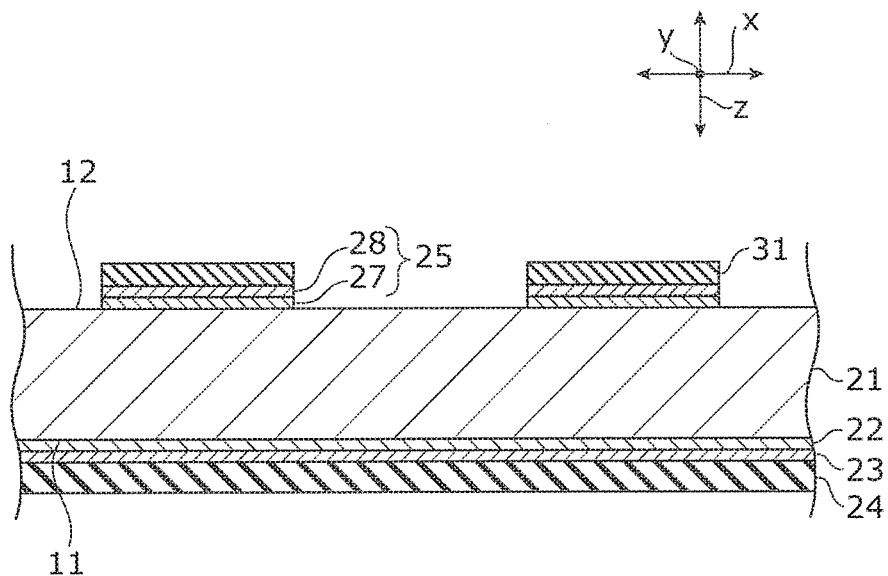
FIG. 8 is a schematic cross sectional view illustrating a process in the manufacturing of a solar cell according to an embodiment.

Next, as illustrated in FIG. 8, the layers stacked on the back surface 12 are patterned. First, the insulating layer 31 is partially etched and removed. A resist film is used as a mask in the etching of the insulating layer 31. The resist film is formed by, for example, a photolithography or application process such as screen printing or ink jet printing. When the insulating layer 31 is made of oxidized silicon (SiO2), silicon nitride (SiN), or silicon oxynitride (SiON), a hydrogen fluoride (HF) aqueous solution may be used in the etching.

After the etching of the insulating layer 31 is complete, the resist film is removed and the exposed IN layer 25 is etched using the patterned insulating layer 31 as a mask. An alkaline etching liquid such as a sodium hydroxide (NaOH) aqueous solution (for example, 1 at. % NaOH aqueous solution) is used in the etching of the IN layer 25 With this, patterned IN layer 25 and insulating layer 31 are formed on the back surface 12.

In the etching of the IN layer 25, the IP layer 26, and the insulating layer 31, for example, an etching paste or an etching ink whose viscosity has been adjusted may be used. In this case, etching paste may be applied, via, for example, screen printing or ink jet printing, in the region in from which the IN layer 25, etc., were removed.

Figure 9:
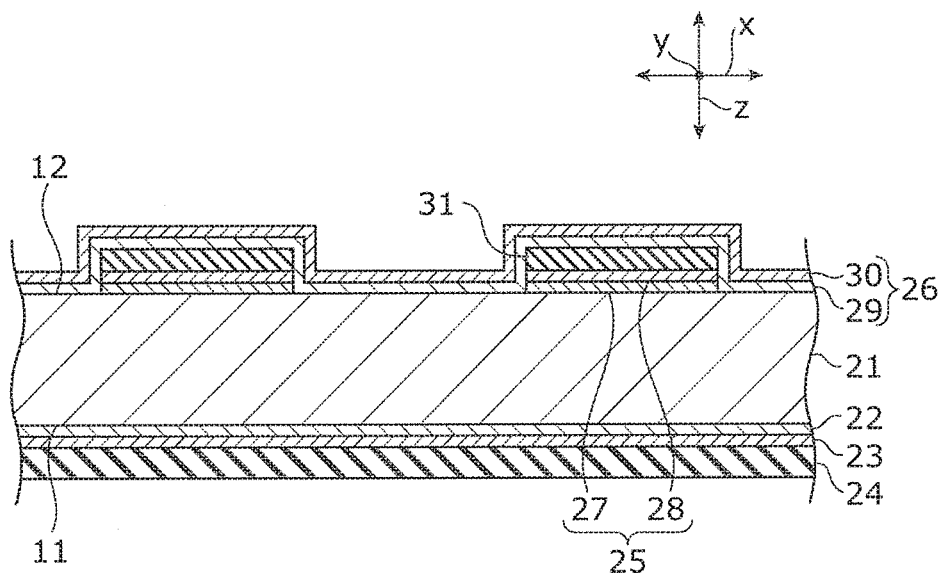
FIG. 9 is a schematic cross sectional view illustrating a process in the manufacturing of a solar cell according to an embodiment.

Next, as illustrated in FIG. 9, the IP layer 26 is stacked in all areas, excluding end regions on the back surface 12. In other words, IP layer 26 is stacked on IN layer 25 as well, with insulating layer 31 interposed therebetween. Similar to the IN layer 25, the IP layer 26 may be formed by depositing, via PECVD, the i-type amorphous silicon layer 29 and the p-type amorphous silicon layer 30 in the listed order. However, in the stacking of the p-type amorphous silicon layer 30, diborane (B2H6), for example, is used as a source gas instead of PH3.

Figure 10:
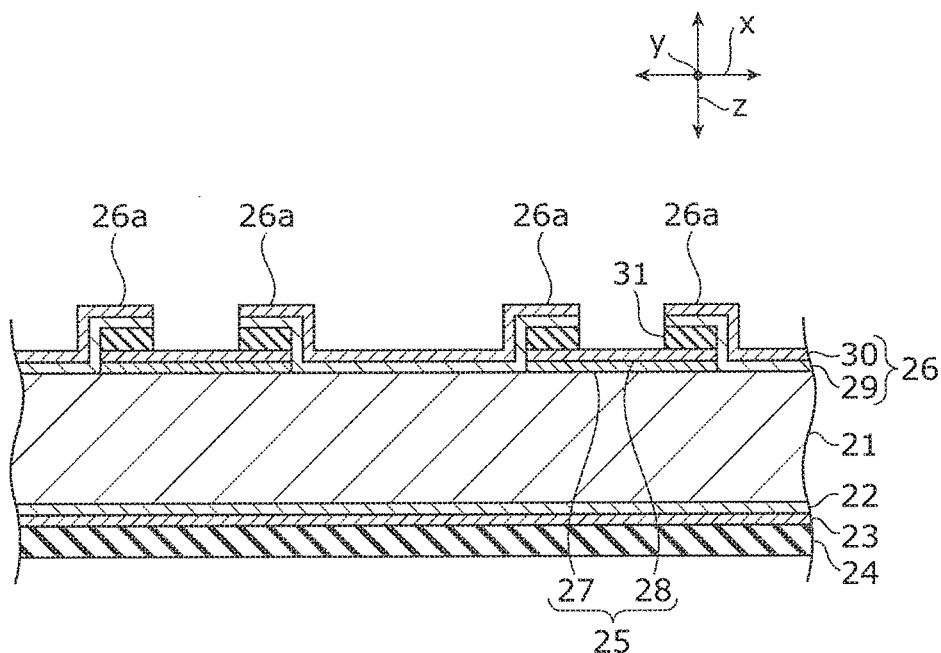
FIG. 10 is a schematic cross sectional view illustrating a process in the manufacturing of a solar cell according to an embodiment.

Next, as illustrated in FIG. 10, the IP layer 26 stacked on the IN layer 25 is patterned and the insulating layer 31 is selectively removed to produce the photoelectric conversion unit 20. In this process, first, the IP layer 26 stacked on the IN layer 25 is partially etched and removed. The region in which the IP layer 26 is removed is the region above the IN layer 25 in which the n-side electrode 40 is to be formed in a subsequent process. In the etching of the IP layer 26, a resist film formed by, for example, a screen printing process, is used as a mask, and an alkaline etching solution, such as an NaOH aqueous solution, is used. In this process, the protected region in which the resist film is formed is the overlapping portion 26a of the IP layer 26 and the region from which the IN layer 25 has been removed.

Since the IP layer 26 is usually more difficult to etch than the IN layer 25, an aqueous solution that is more concentrated than the NaOH aqueous solution used for the IN layer 25 (for example, a 10 at. % NaOH aqueous solution), or a fluonitric acid (a mixed aqueous solution of HF and HNO3 (for example, a mixture of a 30 at. % HF aqueous solution and a 30 at. % HNO3 aqueous solution) is preferably used. Alternatively, using an NaOH aqueous solution heated to about 70 to 90 degrees Celsius (a heat-and alkali-treated NaOH aqueous solution) is also preferred.

Next, after the etching of the IP layer 26, the resist film is removed, and, using the patterned IP layer 26 as a mask, the exposed insulating layer 31 is etched and removed using an HF aqueous solution. Part of the IN layer 25 is exposed as a result of part of the insulating layer 31 being removed.

Figure 11:
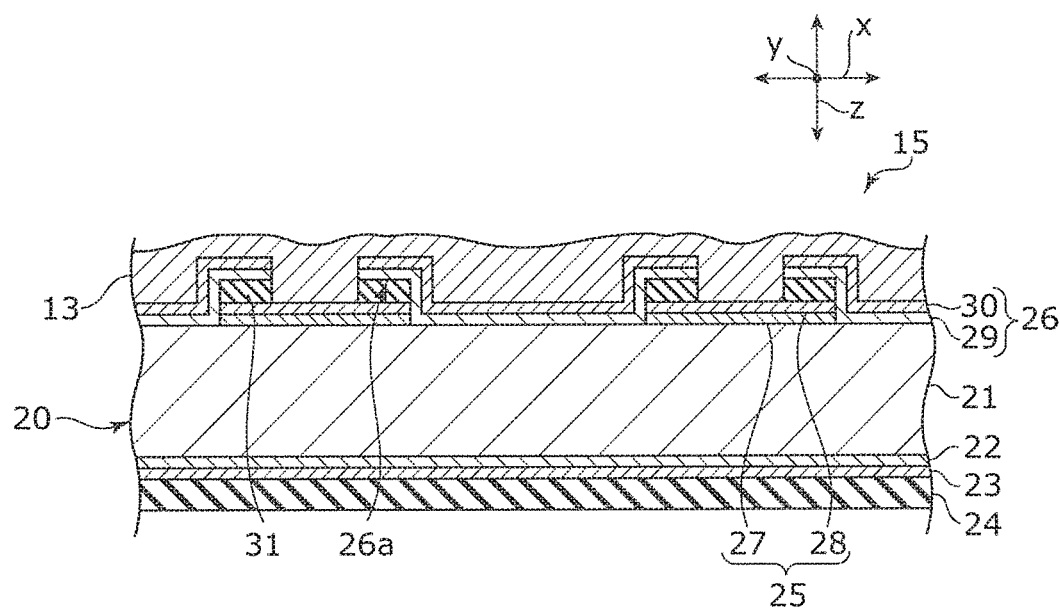
FIG. 11 is a schematic cross sectional view illustrating a process in the manufacturing of a solar cell according to an embodiment.

Next, as illustrated in FIG. 11, a base layer 13 is formed on the IN layer 25 and on the IP layer 26. The base layer 13 is stacked on all regions of the IN layer 25 and the IP layer 26.

With this, the solar cell structure 15 is produced.

Next, with reference to FIG. 12 and FIG. 13, the forming processes of the electrode pattern will be described.

Figure 12:
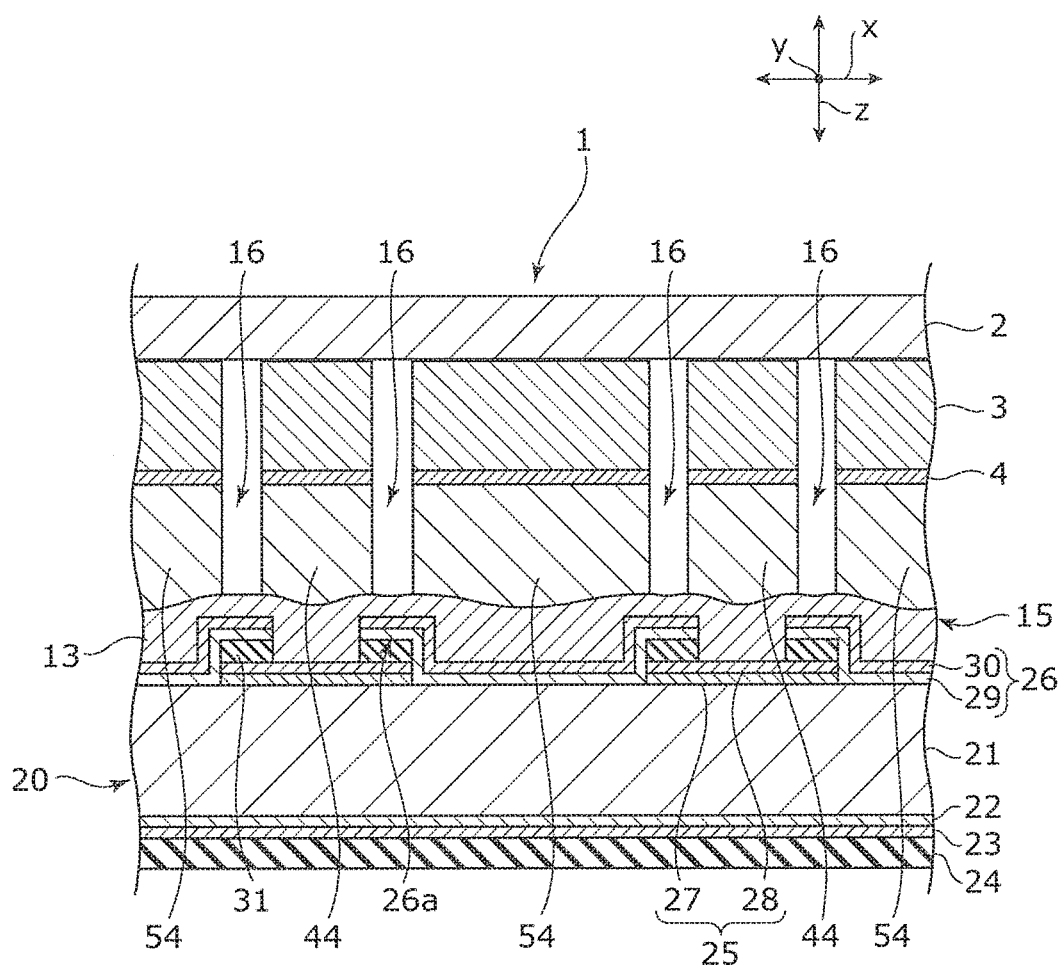
FIG. 12 is a schematic cross sectional view illustrating a process in the manufacturing of a solar cell according to an embodiment.

As illustrated in FIG. 12, the electrode layer transfer sheet 1 is disposed on the base layer 13 of the solar cell structure 15 such that the n-side main conducting layer 44 and the p-side main conducting layer 54, which are the electrode layers, are in contact with the base layer 13. As previously described with reference to FIG. 1, the electrode layer transfer sheet 1 includes the base material 2, the seed layer 3 formed on the base material 2, the organic material layer 4 formed on the seed layer 3, the n-side main conducting layer 44 formed on the organic material layer 4, and the p-side main conducting layer 54 formed on the organic material layer 4. In this embodiment, a glass substrate is used as the base material 2, a Cu layer is used as the seed layer 3, and glycol is used as the organic material layer 4.

In this embodiment, the seed layer 3 may be formed by forming a Cu layer and patterning the formed Cu layer. The Cu layer may be formed by a thin film forming method, such as a sputtering or CVD method. The Cu layer may also be formed by an electroplating process or an electroless plating process. The patterning may be performed using a photolithography method, for example. The shape in which the Cu layer is patterned corresponds to the electrode pattern of the n-side main conducting layer 44 and the p-side main conducting layer 54. More specifically, the n-side main conducting layer 44 and the p-side main conducting layer 54 have the same pattern as the n-side electrode 40 and the p-side electrode 50 illustrated in FIG. 5

As an alternate to the above forming method, the patterned seed layer 3 may be formed by applying, on the base material 2, a paste including electrically conductive particles via a screen printing or ink jet process, as described above.

In this embodiment, the organic material layer 4 is formed by applying glycol on the seed layer 3.

In this embodiment, the n-side main conducting layer 44 and the p-side main conducting layer 54 are formed by forming a Cu layer via an electroplating process using the seed layer 3 as a seed. This makes it possible to form the n-side main conducting layer 44 and the p-side main conducting layer 54 in the same pattern as the seed layer 3. The electroplating process is preferably performed in parallel with the processes for forming the solar cell structure 15 illustrated in FIG. 7 though FIG. 11. In the electrode layer transfer sheet 1, a void 16 is formed between the n-side main conducting layer 44 and the p-side main conducting layer 54, as illustrated in FIG. 12.

Next, in a state in which the electrode layer transfer sheet 1 is disposed such that the n-side main conducting layer 44 and the p-side main conducting layer 54 are in contact with the base layer 13, the electrode layer transfer sheet 1 is pressed onto the base layer 13 to pressure bond the n-side main conducting layer 44 and the p-side main conducting layer 54 to the base layer 13. In this state, when the base material 2 is picked up, separation occurs between (i) the n-side main conducting layer 44 and the p-side main conducting layer 54 and (ii) the organic material layer 4, whereby the base material 2 can be removed along with the organic material layer 4 and the seed layer 3. The seed layer 3 and the organic material layer 4 remain on the removed base material 2. Thus, the n-side main conducting layer 44 and the p-side main conducting layer 54 can be formed again on the organic material layer 4 of the removed base material 2 via an electroplating processes so that the configuration can be reused as a new electrode layer transfer sheet 1.

The n-side main conducting layer 44 and the p-side main conducting layer 54 can be formed on the base layer 13 in this manner.

Figure 13:
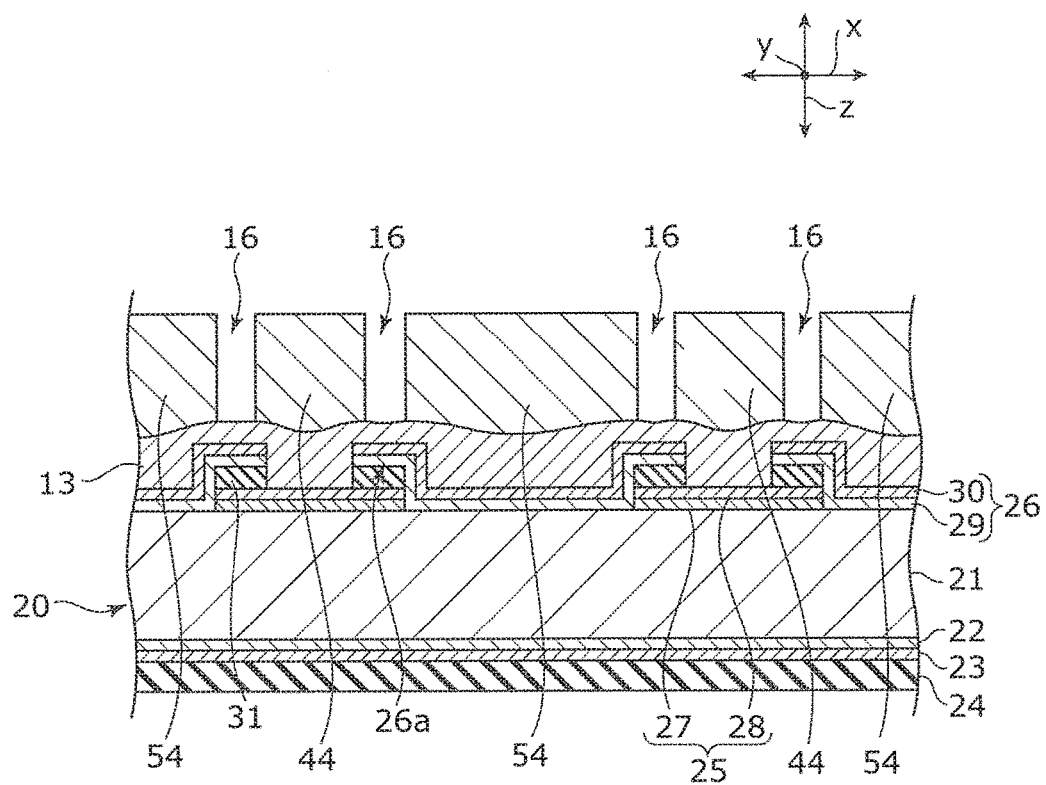
FIG. 13 is a schematic cross sectional view illustrating a process in the manufacturing of a solar cell according to an embodiment.

FIG. 13 illustrates a state in which the n-side main conducting layer 44 and the p-side main conducting layer 54 are formed on the base layer 13. As illustrated in FIG. 13, the void 16 is formed between the n-side main conducting layer 44 and the p-side main conducting layer 54. Next, the base layer 13 is etched using the n-side main conducting layer 44 and the p-side main conducting layer 54 as a mask. This divides the base layer 13 such that the n-side base layer 43 and the p-side base layer 53 are separated from each other, as illustrated in FIG. 6. The base layer 13 may be etched using, for example, a hydrogen chloride (HCl) aqueous solution or an oxalic acid.

With this, the solar cell 10 illustrated in FIG. 6 is produced.

In this embodiment, the n-side main conducting layer 44 and the p-side main conducting layer 54 are formed using the electrode layer transfer sheet 1. Accordingly, the electrode pattern can be formed using a simple process. More specifically, since the removed base material can be reused to form another electrode pattern, solar cells can be formed at low cost. Furthermore, since the process for forming the solar cell structure 15 and the electroplating process can be performed in parallel, the manufacturability of the solar cell 10 can be increased.

The present embodiment may be modified within the scope of the claims.

For example, in this embodiment, the IP layer 26 is stacked after the IN layer 25 is stacked, but the IP layer 26 may be stacked first. In this case, it is preferable that a portion of the IN layer 25 overlaps a portion of the IP layer 26.

Moreover, in this embodiment, the n-type region and the p-type region are formed such that the IN layer 25 and the IP layer 26 are formed on the back surface 12 of the n-type monocrystalline silicon substrate 21 in interdigitating, comb-like patterns, but the regions may be formed by thermally diffusing a dopant. For example, a heavily doped n-type region may be formed by thermally diffusing an n-type dopant in one region on the back surface 12, and the p-type region may be formed by thermally diffusing a p-type dopant in another region on the back surface 12.

Moreover, in this embodiment, the solar cell 10 is exemplified as a back contact solar cell, but the present disclosure is not limited to this example. The techniques of the present disclosure are also applicable to a solar cell including electrodes formed on the light receiving surface.

Moreover, the substrate on which the electrode pattern is to be formed via the techniques of the present disclosure is not limited to a solar cell structure; the techniques of the present disclosure are applicable to other objects as well.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A method of manufacturing a solar cell, the method comprising:
    producing a solar cell structure on which an electrode pattern is to be formed;
    producing an electrode layer transfer sheet by forming, on a base material including (i) a seed layer having a pattern corresponding to the electrode pattern and (ii) an organic material layer formed on the seed layer, an electrode layer via an electroplating process using the seed layer as a seed, the electrode layer being formed on the organic material layer of the base material;
    disposing the electrode layer transfer sheet on the solar cell structure such that the electrode layer is in contact with the solar cell structure and pressure bonding the electrode layer to the solar cell structure; and
    in a state in which the electrode layer is pressure bonded to the solar cell structure, removing the base material along with the organic material layer and the seed layer to transfer the electrode layer to the solar cell structure, wherein the solar cell is a back contact solar cell, the solar cell structure includes: a first stacked layer including an n-type amorphous silicon layer; a second stacked layer including a p-type amorphous silicon layer; and a base layer that comprises a transparent conducting layer and covers the first stacked layer and the second stacked layer, and in the disposing, the electrode layer transfer sheet is disposed on the solar cell structure such that the electrode layer is in contact with the base layer.

2. The method according to claim 1, further comprising, after the disposing, etching the base layer using the electrode layer as a mask so as to divide the base layer.

3. The method according to claim 1, wherein the seed layer is a copper layer.

4. The method according to claim 1, wherein the electrode layer is a copper layer.

5. The method according to claim 1, wherein the producing of the electrode layer transfer sheet and the producing of the solar cell structure are performed in parallel.

\* \* \* \* \*